(12) United States Patent
Kaneda

(10) Patent No.: US 7,858,447 B2
(45) Date of Patent: Dec. 28, 2010

(54) LEAD FRAME, SEMICONDUCTOR DEVICE, AND METHOD OF MANUFACTURING SEMICONDUCTOR DEVICE

(75) Inventor: Yoshiharu Kaneda, Ohtsu (JP)

(73) Assignee: Renesas Electronics Corporation, Kanagawa (JP)

( * ) Notice: Subject to any disclaimer, the term of this patent is extended or adjusted under 35 U.S.C. 154(b) by 107 days.

(21) Appl. No.: 12/203,374

(22) Filed: Sep. 3, 2008

(65) Prior Publication Data

US 2009/0057857 A1 Mar. 5, 2009

(30) Foreign Application Priority Data

Sep. 5, 2007 (JP) ............................. 2007-229726

(51) Int. Cl.
H01L 21/50 (2006.01)
H01L 21/48 (2006.01)
H01L 21/44 (2006.01)

(52) U.S. Cl. ..................... 438/123; 438/124; 438/121

(58) Field of Classification Search ............... 438/121, 438/123, 124
See application file for complete search history.

(56) References Cited

U.S. PATENT DOCUMENTS

| 5,296,737 | A | * | 3/1994 | Nishimura et al. | ........... 257/673 |
|---|---|---|---|---|---|
| 5,299,092 | A | * | 3/1994 | Yaguchi et al. | ............. 361/728 |
| 5,572,068 | A | * | 11/1996 | Chun | .......................... 257/686 |
| 5,677,567 | A | * | 10/1997 | Ma et al. | ..................... 257/666 |
| 5,804,874 | A | * | 9/1998 | An et al. | ...................... 257/676 |
| 6,303,981 | B1 | * | 10/2001 | Moden | ....................... 257/666 |
| 6,316,825 | B1 | * | 11/2001 | Park et al. | .................... 257/686 |
| 6,541,856 | B2 | * | 4/2003 | Corisis et al. | ............... 257/723 |
| 2002/0089048 | A1 | * | 7/2002 | Liao et al. | .................... 257/678 |
| 2005/0051875 | A1 | * | 3/2005 | Ichikawa | .................... 257/666 |

FOREIGN PATENT DOCUMENTS

| JP | 6-188280 | 7/1994 |
|---|---|---|
| JP | 11-330347 | 11/1999 |
| JP | 2004-342880 | 12/2004 |

* cited by examiner

Primary Examiner—Luan C Thai
(74) Attorney, Agent, or Firm—Young & Thompson

(57) ABSTRACT

A lead frame according to one aspect of the present invention is used for a resin-sealed-type semiconductor device and includes a first lead frame having a frame body part and a lead part, and a second lead frame having a frame body part and a lead part. The lead part of the first lead frame and the lead part of the second lead frame do not contact with each other and an inner lead part formed in the lead part of the first lead frame and an inner lead part formed in the lead part of the second lead frame are provided in substantially the same plane when the frame body part of the first lead frame and the frame body part of the second lead frame are laminated together.

20 Claims, 9 Drawing Sheets

PRIOR ART

Fig. 8A       PRIOR ART
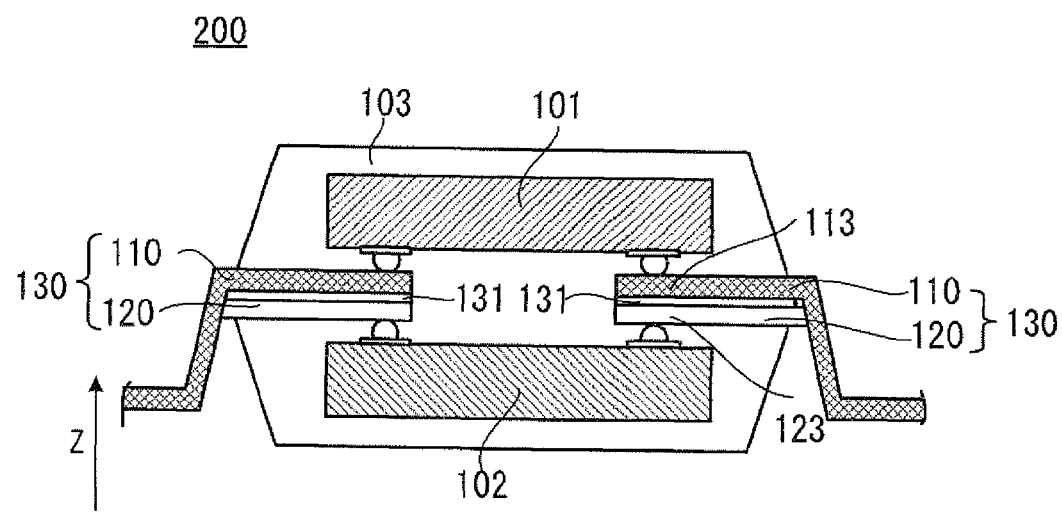
Fig. 8B       PRIOR ART
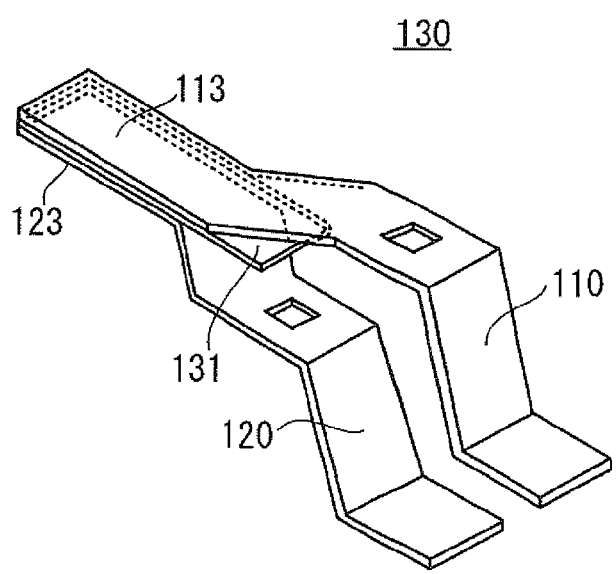

LEAD FRAME, SEMICONDUCTOR DEVICE, AND METHOD OF MANUFACTURING SEMICONDUCTOR DEVICE

BACKGROUND OF THE INVENTION

1. Field of the Invention

The present invention relates to a lead frame used for a resin-sealed-type semiconductor device, a semiconductor device using the lead frame, and a method of manufacturing the semiconductor device.

2. Description of Related Art

A SiP (System in Package) technique having a plurality of semiconductor chips such as a memory or a CPU (central processing unit) mounted on one package has been developed.

FIG. 7 shows a side view of a semiconductor device having an SiP structure according to a prior art 1 (Japanese Unexamined Patent Application Publication No. 06-188280 (Sasaki et al.) FIGS. 1 and 3)). A semiconductor device 100 according to the prior art 1 includes an upper stage side semiconductor chip 101 flip-chip mounted on a surface of a plurality of inner lead parts 133 formed on one lead frame 130 and a lower stage side semiconductor chip 102 flip-chip mounted on a rear surface of the plurality of inner lead parts 133 as shown in FIG. 7. Then the upper stage side semiconductor chip 101 and the lower stage side semiconductor chip 102 are opposed to each other. In order to keep electrical isolation between the upper stage side semiconductor chip 101 and the lower stage side semiconductor chip 102, the inner lead parts electrically connected to the upper stage side semiconductor chip 101 and the inner lead parts electrically connected to the lower stage side semiconductor chip 102 are separated, and they are not commonly used. Sasaki et al. also discloses a structure in which electrode planes of two semiconductor chips are back-to-back opposed to each other contrary to the example of FIG. 7 and the semiconductor chips are electrically connected to the lead frame by wire bonding.

FIG. 8A shows a side view of a semiconductor device having an SiP structure according to a prior art 2 (Japanese Unexamined Patent Application Publication No. 11-330347 (FIGS. 7 and 8)) and FIG. 8B shows a partially enlarged perspective view of lead frames used for the semiconductor device. A semiconductor device 200 according to the prior art 2 is formed by separate two lead frames as shown in FIG. 8A. More specifically, an upper stage side semiconductor chip 101 is flip-chip mounted on a first lead frame 110 and a lower stage side semiconductor chip 102 is flip-chip mounted on a second lead frame 120. A first inner lead part 113 formed in the first lead frame 110 and a second inner lead part 123 formed in the second lead frame 120 form a laminated structure as shown in FIG. 8B. Further, an insulating layer 131 is interposed between the first inner lead part 113 and the second inner lead part 123 in order to keep electrical insulation.

FIG. 9A shows a top view of a semiconductor device having an SiP structure according to a prior art 3 (Japanese Unexamined Patent Application Publication No. 2004-342880 (FIG. 2)) and FIG. 9B shows a cross sectional view taken along the line IXB-IXB of FIG. 9A. As shown in FIGS. 9A and 9B, a semiconductor device 300 according to the prior art 3 includes an upper stage side semiconductor chip 101 and a lower stage side semiconductor chip 102 mounted by flip chip mount using three lead frames 130 (first lead frame 110, second lead frame 120, and third lead frame 140) having different steps.

In the semiconductor device 100 according to the prior art 1, two semiconductor chips are flip-chip mounted using one lead frame, as described above. Therefore, the flip chip mount of the upper stage side semiconductor chip 101 can be performed with the traditional technique. On the other hand, the flip chip mount of the lower stage side semiconductor chip 102 needs to be performed by inverting top and bottom direction of the lead frame 130 after mounting the upper stage side semiconductor chip 101. At this time, the upper stage side semiconductor chip 101 may be stressed or interfere with the stage. Even when the connection is made by wire bonding, the same problem may occur in the upper stage side semiconductor chip or the wire connected to the upper stage side semiconductor chip and the lead frame.

The semiconductor device 200 according to the prior art 2 employs the structure in which two lead frames are laminated in a vertical direction and the insulating layer 131 is interposed between a gap of the two lead frames, as shown in FIG. 8B. Therefore, there is caused a problem that the thickness of the package (Z direction in FIG. 8B) increases.

In the semiconductor device 300 according to the prior art 3, the first lead frame 110, the second lead frame 120, and the third lead frame 140 have different steps, which causes a problem that the thickness of the package (Z direction in FIG. 9B) increases.

SUMMARY

A lead frame according to one aspect of the present invention is used for a resin-sealed-type semiconductor device and includes a first lead frame having a frame body part and a lead part, and a second lead frame having a frame body part and a lead part. The lead part of the first lead frame and the lead part of the second lead frame do not contact with each other and an inner lead part formed in the lead part of the first lead frame and an inner lead part formed in the lead part of the second lead frame are provided in substantially the same plane when the frame body part of the first lead frame and the frame body part of the second lead frame are laminated together.

A semiconductor device according to another aspect of the present invention includes a first lead frame including a frame body part and a lead part, a second lead frame including a frame body part and a lead part, an upper stage side semiconductor chip electrically connected to the inner lead part of the first lead frame, and a lower stage side semiconductor chip electrically connected to the inner lead part of the second lead frame. In the semiconductor device, the upper stage side semiconductor chip and the lower stage side semiconductor chip are provided in top and bottom direction with the inner lead part of the first lead frame and the inner lead part of the second lead frame interposed therebetween, and the frame body part of the first lead frame and the frame body part of the second lead frame are laminated together.

A method of manufacturing a semiconductor device according to a further aspect of the present invention includes the steps of fixing an upper stage side semiconductor chip on a front surface of an inner lead part of a first lead frame and a lower stage side semiconductor chip on a rear surface of an inner lead part of a second lead frame, overlapping at least a part of a frame body part of the first lead frame and a part of a frame body part of the second lead frame, sealing with a mold resin the upper stage side semiconductor chip, the lower stage side semiconductor chip, the inner lead part of the first lead frame, and the inner lead part of the second lead frame, and separating the semiconductor device by removing the frame body part of the first lead frame and the frame body part of the second lead frame.

According to the lead frame of the present invention, the lead part of the first lead frame and the lead part of the second lead frame do not touch with each other and the inner lead part formed in the lead part of the first lead frame and the inner lead part formed in the lead part of the second lead frame are arranged in substantially the same plane. Accordingly, the lead part may be structured as if it is formed by one lead frame when the frame body part of the first lead frame and the frame body part of the second lead frame are laminated together. Since the frame body part of the first lead frame and the frame body part of the second lead frame are removed in the post-process, the semiconductor device manufactured by using the lead frame of the present invention can prevent the thickness of the package from being increased due to the lead frame.

The present invention produces an excellent effect enabling to provide a lead frame in which the thickness of the package of the semiconductor device can be prevented from being increased. Further, it is possible to provide a semiconductor device which can prevent the thickness of the package from being increased due to the lead frame and a method of manufacturing the semiconductor device.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 8A is a cross sectional view of a semiconductor device according to a prior art 2;

FIG. 8B is a perspective view of a main part of lead frames according to the prior art 2;

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

One example of the embodiment to which the present invention is applied will be described hereinafter in detail. Note that other embodiments also belong to the scope of the present invention so long as the embodiments correspond to the spirit of the present invention. The size of each element is not drawn to scale, but is instead drawn to best illustrate the details of the structure.

First Embodiment

Figure 1A:
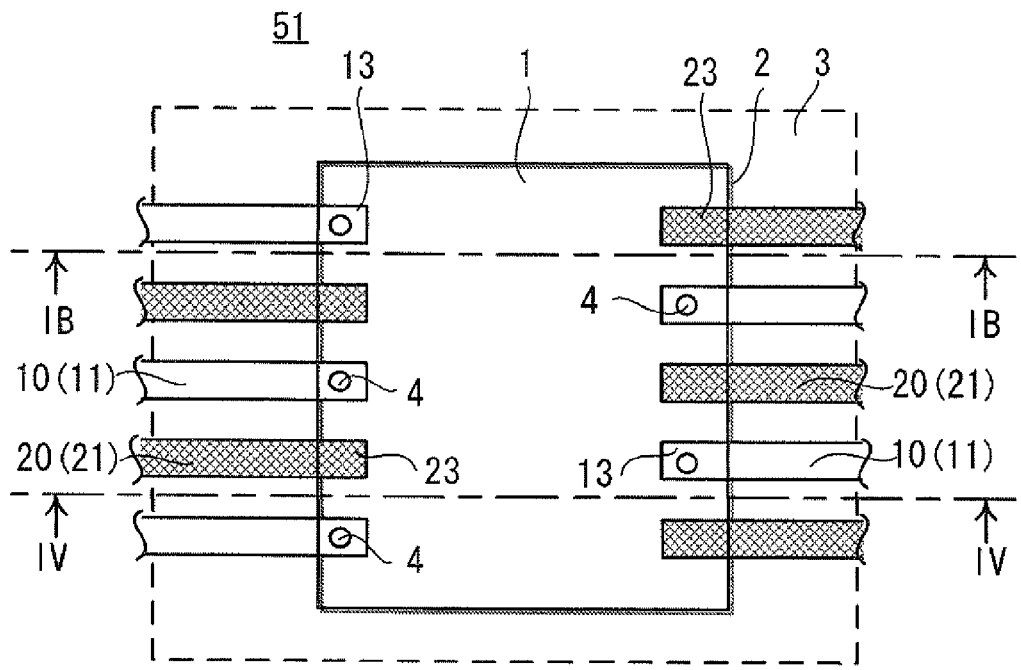
FIG. 1A is a plane view of a semiconductor device according to a first embodiment.
Figure 1B:
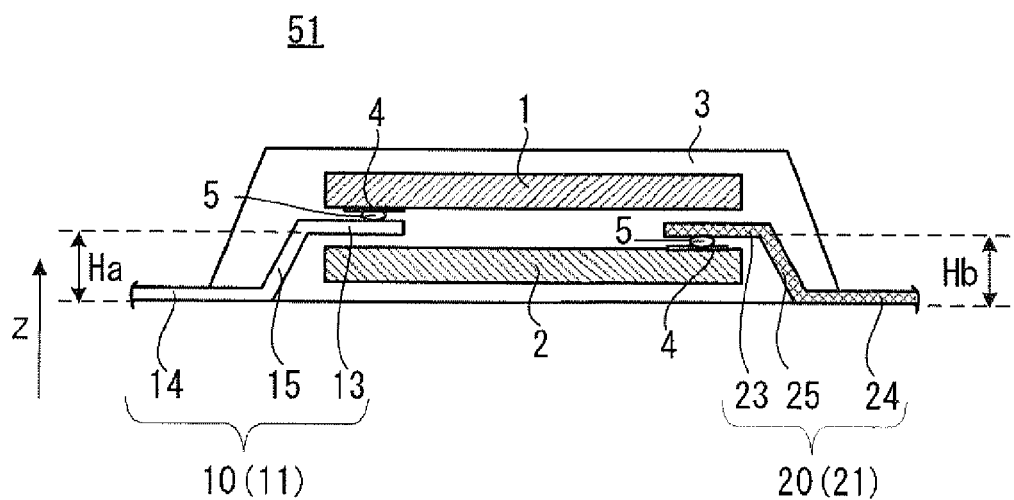
FIG. 1B is a cross sectional view taken along the line IB-IB of FIG. 1A.

FIGS. 1A and 1B show a semiconductor device 51 according to the first embodiment. FIG. 1A shows a plane view of the semiconductor device 51, and FIG. 1B is a cross sectional view taken along the line IB-IB of FIG. 1A. As shown in FIGS. 1A and 1B, the semiconductor device 51 includes an upper stage side semiconductor chip 1, a lower stage side semiconductor chip 2, a first lead frame 10, and a second lead frame 20 and the like. In FIG. 1A, a position where a mold resin 3 is formed is shown in dotted lines, and the upper stage side semiconductor chip 1 is shown as if it is transparent in order to explain the underlayer structure of the upper stage side semiconductor chip 1 for the sake of convenience.

In the semiconductor device 51 according to the first embodiment, the upper stage side semiconductor chip 1 and the lower stage side semiconductor chip 2 having substantially the same size and the same shape are opposed to each other with inner lead parts of lead frames interposed therebetween. Different kind of chips such as a microcomputer and a memory or the like or same kind of semiconductor chips may be used as the upper stage side semiconductor chip 1 and the lower stage side semiconductor chip 2. When the memories are mounted on the upper stage side semiconductor chip 1 and the lower stage side semiconductor chip 2, the capacity can be doubled.

As stated above, in the prior art 1, the upper stage side semiconductor chip 101 and the lower stage side semiconductor chip 102 are mounted on one lead frame 130. On the other hand, in the semiconductor device 51 according to the first embodiment of the present invention, the upper stage side semiconductor chip 1 and the lower stage side semiconductor chip 2 are mounted on the separate lead frames (first lead frame 10 and second lead frame 20).

Figure 2A:
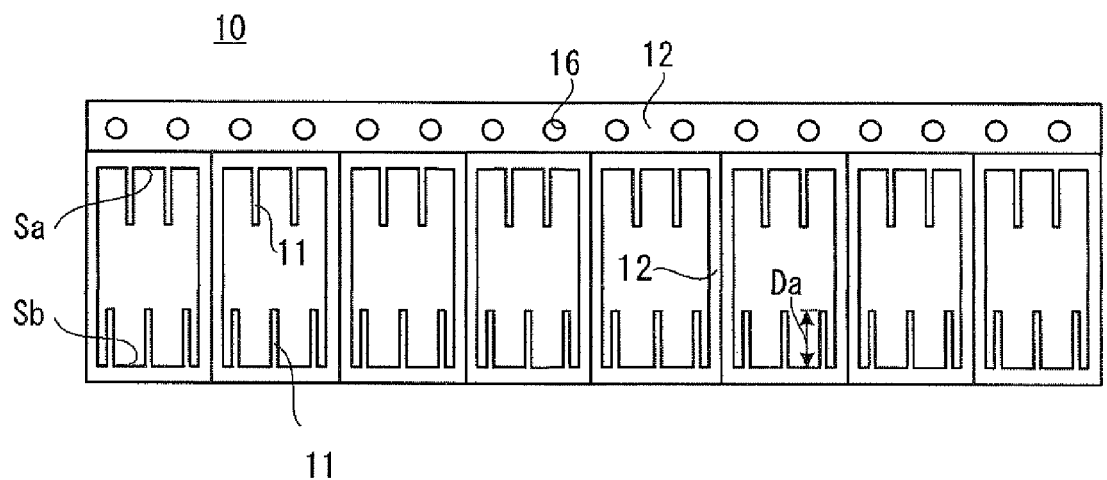
FIG. 2A is a plane view of a first lead frame according to the first embodiment.
Figure 2B:
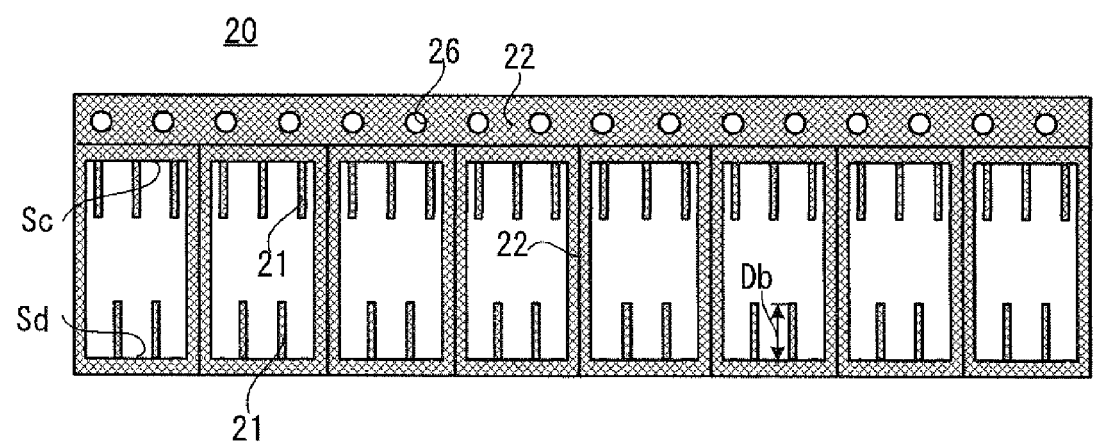
FIG. 2B is a plane view of a second lead frame according to the first embodiment.
Figure 2C:
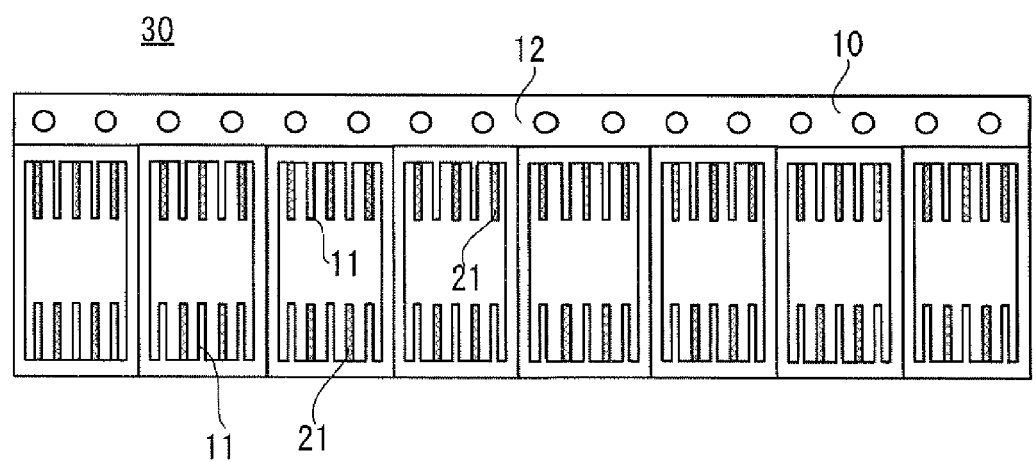
FIG. 2C is a plane view of a laminated-type lead frame according to the first embodiment.

FIG. 2A is a plane view of the first lead frame 10, FIG. 2B is a plane view of the second lead frame 20, and FIG. 2C is a plane view of a lead frame 30 having a laminated structure in which the first lead frame 10 and the second lead frame 20 are integrally laminated together. The first lead frame 10 includes a first lead part 11, a first frame body part 12, a first alignment part 16, and eight rectangular hollow parts and the like, as shown in FIG. 2A. The first frame body part 12 is apart which is removed in the post-process described later in detail and does not remain in an end product. A plurality of first alignment parts 16 are formed in line near one side of the peripheral frame of the first frame body part 12.

Five first lead parts 11 protruding in a comb shape in a planar view are formed in each of the eight hollow parts of the first lead frame 10. Two of the five first lead parts 11 are formed in an Sa side where the first alignment parts 16 are formed among the sides forming the hollow part, and the rest of the three first lead parts 11 are formed in an Sb side opposed to the side Sa.

The second lead frame 20 includes a second lead part 21, a second frame body part 22, a second alignment part 26, eight rectangular hollow parts and the like, as shown in FIG. 2B. The second frame body part 22 is removed in the later post-process described later and does not remain in the end product. A plurality of second alignment parts 26 are formed in line near one side of the peripheral frame of the second frame body part 22. Five second lead parts 21 protruding in a comb shape in a planar view are formed in each of the eight hollow parts of the second lead frame 20. Three of the five second lead parts 21 are formed in an Sc side where the second alignment parts 26 are formed among the sides forming the hollow part, and the rest of the two second lead parts 21 are formed in an Sd side opposed to the side Sc.

The first lead frame 10 and the second lead frame 20 are laminated together so as to function as one integrated lead frame 30 (lead frame 30 having a laminated structure) as shown in FIG. 2C in the manufacturing process of the semiconductor device 51 according to the first embodiment. At least a part of the first frame body part 12 of the first lead frame 10 and a part of the second frame body part 22 of the second lead frame 20 are overlapped with each other. In the first embodiment, the frame body parts have substantially the same shape and are formed to be overlapped in a whole region. In the first embodiment, alignment is executed by the first alignment part 16 having a plurality of through holes and the second alignment part 26 having a plurality of through holes.

In laminating the first lead frame 10 and the second lead frame 20, the first lead part 11 of the first lead frame 10 and the second lead part 21 of the second lead frame 20 are formed so as not to touch with each other, as shown in FIG. 2C. Further, the first inner lead part 13 and the second inner lead part 23 are provided in substantially the same plane. As described above, the first frame body part 12 and the second frame body part 22 are removed in the later post-process and do not remain in the end product. Therefore, only the first lead part 11 and the second lead part 21 remain as the end product. Hence, the end product is formed as if it is manufactured by one lead frame.

The first lead part 11 formed in the first lead frame 10 includes a first inner lead part 13, a first outer lead part 14, and a first rising part 15 and the like. The first inner lead part 13 is where the upper stage side semiconductor chip 1 is mounted, and is sealed with a mold resin 3. The first outer lead part 14 is connected to the first frame body part 12, and a part of the first outer lead part 14 is protruded from the region sealed with the mold resin 3. The first rising part 15 is for connecting the first inner lead part 13 and the first outer lead part 14, and a step is formed from the first outer lead part 14 toward the first inner lead part 13. The inner lead part is connected to the terminal electrode on the semiconductor chip, and the outer lead part functions as the external terminal connected to the printed board.

The second lead part 21 formed in the second lead frame 20 includes a second inner lead part 23, a second outer lead part 24, and a second rising part 25 and the like. The second inner lead part 23 is where the lower stage side semiconductor chip 2 is mounted and is sealed with the mold resin 3. The second outer lead part 24 is connected to the second frame body part 22, and a part of the second outer lead part 24 is protruded from the region sealed with the mold resin 3. The second rising part 25 is for connecting the second inner lead cart 23 and the second outer lead part 24, and a step is formed from the second outer lead part 24 toward the second inner lead part 23.

In the first embodiment, a distance Da (see FIG. 2A) from the top of the first inner lead part 13 to the first frame body part 12 in the planar view and a distance Db (see FIG. 2B) from the top of the second inner lead part 23 to the second frame body part 22 in the planar view are substantially the same. Although the first rising part 15 and the second rising part 25 are sealed with the mold resin 3 in the first embodiment, the embodiment is not limited to this case but can be formed protruding from the region sealed with the mold resin 3. The height of the first rising part 15, which is the height of the step Ha between the first inner lead part 13 and the first outer lead part 14 in a Z direction in FIG. 1B, is the same for all the first rising parts 15 in the first lead part 11 in the first lead frame 10. Further, the height of the second rising part 25, which is the height of the step Hb between the second inner lead part 23 and the second outer lead part 24 in a Z direction in FIG. 1B, is the same for all the second rising parts 25 in the second lead part 21 in the second lead frame 20. The height of the step Ha of the first rising part 15 and the height of the step Hb of the second rising part 25 are made to be the same.

Figure 4A:
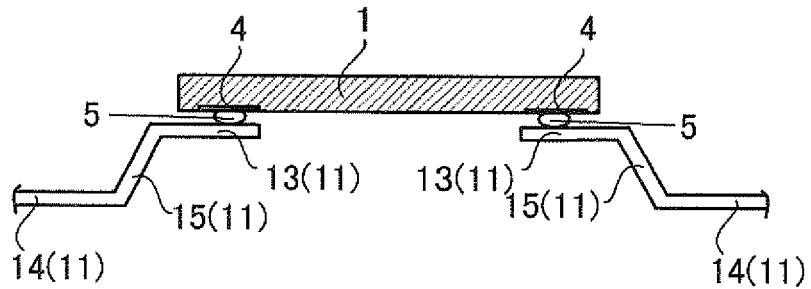
FIGS. 4A to 4C each shows a cross sectional view of a main part explaining a manufacturing process of the semiconductor device according to the first embodiment.
Figure 4B:
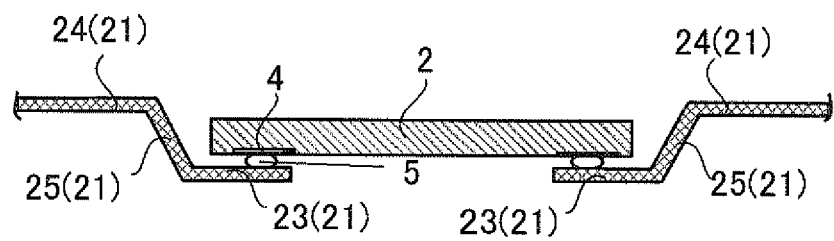
Figure 4C:
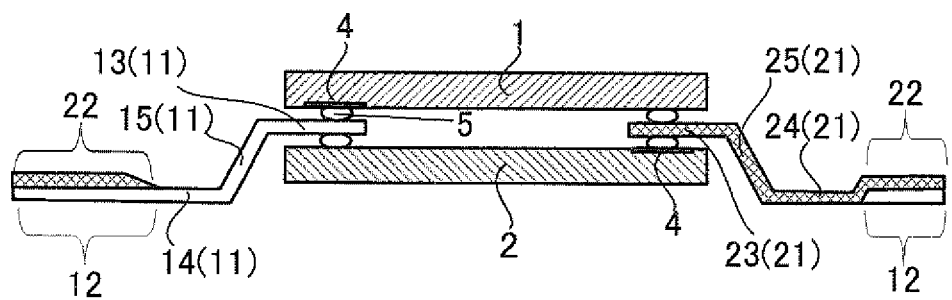

The height of the first frame body part 12 or/and the height of the second frame body part 22 are adjusted so that each of the first inner lead part 13 and the second inner lead part 23, and the first outer lead part 14 and the second outer lead part 24 is provided in the same plane when the first frame body part 12 of the first lead frame 10 and the second frame body part 22 of the second lead frame 20 are laminated together. For example, as shown in FIG. 4C, the first frame body part 12 and the first outer lead part 14 are formed in the same height, and the first outer lead part 14 and the second outer lead part 24 are formed to be in substantially the same plane when the first lead frame 1C and the second lead frame 20 are laminated together. The second frame body part 22 is formed so that it overlaps with the first frame body part 12 and forms a step with respect to the second outer lead part 24 when the first lead frame 10 and the second lead frame 20 are laminated together.

In the upper stage side semiconductor chip 1, a first terminal electrode 4 electrically connected to the first inner lead part 13 is formed in a main surface (front surface) of the side opposed to the first inner lead part 13. Further, in the lower stage side semiconductor chip 2, a second terminal electrode 4 electrically connected to the second inner lead part 23 is formed in a main surface (rear surface) of the side provided on the second inner lead part 23. These terminal electrodes can be plating electrodes such as gold plating or silver plating including underlying plating film such as aluminum, aluminum alloy, or Ti/Ni, for example. These terminal electrodes and the inner lead parts are flip-chip mounted by using solder or conductive paste or the like and are electrically connected together.

The first lead part 11 and the second lead part 21 are alternately arranged in the side Sa and the side Sb respectively, as shown in FIGS. 1A and 2C. Further, the first lead part 11 and the second lead part 21 are opposed to each other in the side Sa and the side Sb. In other words, the first lead part 11 and the second lead part 21 are formed to be a staggered pattern in the planar view. The upper stage side semiconductor chip 1, the lower stage side semiconductor chip 2, the first inner lead part 13, the second inner lead part 23 or the like thus formed have a structure sealed by the mold to be packaged. Note that the arrangement or shape of the first lead part 11 and the second lead part 21 is merely an example, and can be changed as appropriate according to its application.

Figure 3:
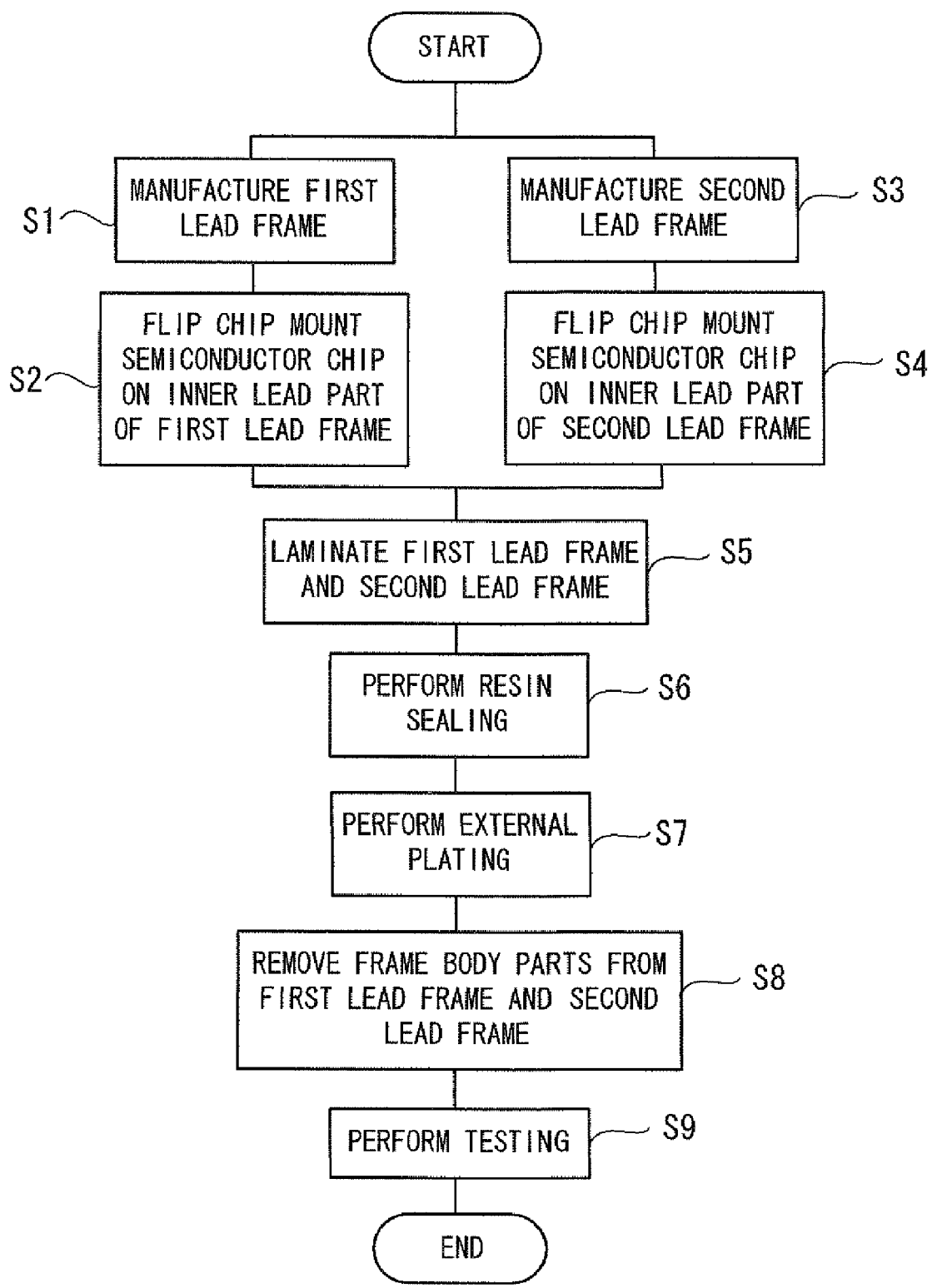
FIG. 3 is a flow chart of a manufacturing process of the semiconductor device according to the first embodiment.

Now, a method of manufacturing the semiconductor device 51 according to the first embodiment will be described. FIG. 3 is a flow chart of the method of manufacturing the semiconductor device 51 according to the first embodiment. FIGS. 4A to 4C each shows a cross sectional view taken along the line IV-IV of FIG. 1A, and shows a cross sectional view of the main part of the semiconductor device 51 for explaining the manufacturing process.

First, the first lead frame 10 is manufactured (S1). The first lead frame 10 is manufactured by a known method such as a stamping (press) method by using a sheet of copper plate, for example. The first inner lead part 13 and the first outer lead part 14 are formed in flat shape. The first rising part 15 is obliquely bent from the first outer lead part 14 toward the first inner lead part 13 and the first inner lead part 13 is bent to be substantially parallel to the main surface of the first frame body part 12.

Then the upper stage side semiconductor chip 1 is flip-chip mounted on the front surface of the inner lead part 13 of the first lead frame 10 (S2) (see FIG. 4A). For example, a protruding electrode 5 such as solder or silver paste is applied on the first inner lead part 13 at a position overlapped with the first terminal electrode 4 in the upper stage side semiconductor chip 1. Then the upper stage side semiconductor chip 1 is mounted on the first inner lead part 13, and process such as baking is performed as needed while adding required load, so that the upper stage side semiconductor chip 1 and the plurality of first inner lead parts 13 are fixed together. Accordingly, the first lead frame 10 and the upper stage side semiconductor chip 1 are electrically connected together. In the same way, the second lead frame 20 is manufactured (S3), and the lower stage side semiconductor chip 2 is flip chip mounted on the rear surface of the second inner lead part 23 of the second lead frame 20 (S4) (see FIG. 4B). Accordingly, the second lead frame 20 and the lower stage side semiconductor chip 2 are electrically connected together.

Next, the first frame body part 12 of the first lead frame 10 and the second frame body part 22 of the second lead frame 20 are overlapped together (S5) (see FIGS. 2C and 4C). To be more specific, top and bottom direction of the second lead frame 20 is inverted from the state shown in FIG. 4B, and then the first lead frame 10 is overlapped on the second lead frame 20. The first frame body part 12 of the first lead frame 10 and the second frame body part 22 of the second lead frame 20 form a frame structure having substantially the same shape, as described above.

In overlapping the first lead frame 10 and the second lead frame 20, by using holes or concave and convex parts for alignment formed in each of the first frame body part 12 of the first lead frame 10 and the second frame body part 22 of the second lead frame 20, relative alignment is performed between them, so as to accurately overlap both lead frames. In the first embodiment, alignment is performed by providing the through holes as described above.

Next, the structure thus formed is set in the mold (not shown) to perform clamping so as to perform resin molding (S6). As shown in FIG. 1A, a region including at least the upper stage side semiconductor chip 1, the lower stage side semiconductor chip 2, the first inner lead part 13, the second inner lead part 23, and the terminal electrode part 4 of each semiconductor chip is sealed with the resin to form a package structure. Accordingly, it is possible to fix the inner lead parts of the first lead frame 10 and the second lead frame 20 in substantially the same plane by using the resin. Note that it is also possible to fix the first lead frame 10 and the second lead frame 20 by using a known method like caulking technique, welding, or bonding along with the fixing method using the resin.

After that, the external plating is performed by a known method (S7). Then the first frame body part 12 of the first lead frame 10 and the second frame body part 22 of the second lead frame 20 are removed by a press device (not shown) so as to obtain the semiconductor device having a separated resin package structure (S8).

Then testing is performed on the obtained semiconductor device (S9) in order to determine condition of the semiconductor device. The semiconductor device thus manufactured is mounted on the printed board or the like. In shipping the semiconductor device as the product, the first inner lead part 13 and the second inner lead part 23 are packaged with a tape.

According to the lead frame 30 of the first embodiment, the first lead part 11 of the first lead frame 10 and the second lead part 21 of the second lead frame 20 do not contact with each other, and the first inner lead part 13 formed in the first lead part 11 and the second inner lead part 23 formed in the second lead part 21 are provided in the same plane. Accordingly, in laminating the first frame body part 12 and the second frame body part 22, each lead part is structured as if it is formed by one lead frame. Since the first frame body part 12 and the second frame body part 22 are removed in the post-process, it is possible to prevent the thickness of the package of the semiconductor device 51 manufactured by using the lead frame 30 according to the first embodiment from being increased due to the lead frame.

Further, the height of the step Ha between the first outer lead part 14 and the first inner lead part 13 formed in the first lead part 11 and the height of the step Hb between the second outer lead part 24 and the second inner lead part 23 formed in the second lead part 21 are made to be the same, whereby it is possible to easily connect the outer lead part and the printed board or the like.

In the semiconductor device 100 according to the prior art 1, stress may be occurred when the semiconductor chip is flip-chip mounted on the rear surface of one lead frame, as described above. On the other hand, according to the first embodiment, the upper stage side semiconductor chip is mounted on the first lead frame and the lower stage side semiconductor chip is mounted on the second lead frame, and then the first lead frame and the second lead frame are laminated together to make the integrated lead frame 30 having a laminated structure. Hence, the above described problem can be solved.

Since the upper stage side semiconductor chip 1 and the lower stage side semiconductor chip 2 have the same shape in the first embodiment, the size of the semiconductor chip can be maximized with respect to the package structure of the semiconductor device. Further, it is possible to select and combine the semiconductor chips mounted on each of the two lead frames, which means this structure has a high degree of flexibility for design in manufacturing. Note that it is also possible to combine the size or the shape of the upper stage side semiconductor chip 1 and the lower stage side semiconductor chip 2 as desired.

Since the two lead frames are laminated together by alignment means such as through holes and clamping is performed by the resin seal process, no special device or process is needed. Note that the first rising part 15 of the first lead frame 10 needs to be bent and the second rising part 25 and overlapped portion of the second frame body part 22 with the first frame body part 12 of the second lead frame 20 need to be bent. The first lead frame 10 and the second lead frame 20 may be bent by using the separate bending mold. Otherwise, the first rising part 15 and the second rising part 25 may be bent by using the same bending mold and then the overlapped portion of the second frame body part 22 may be bent by using another bending mold.

Second Embodiment

Figure 5A:
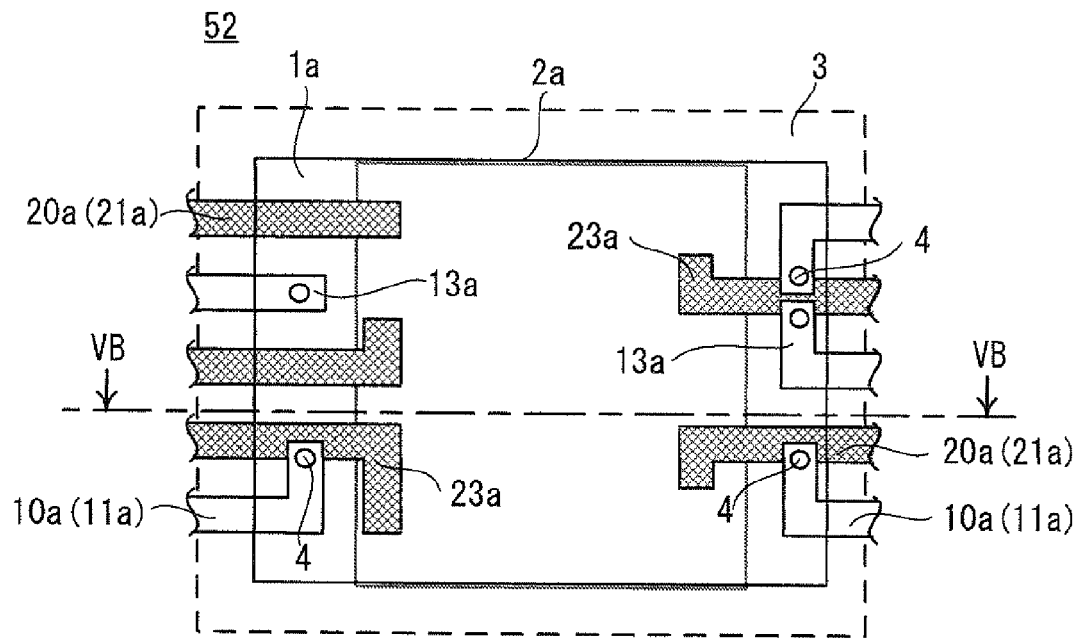
FIG. 5A is a plane view of a semiconductor device according to a second embodiment.
Figure 5B:
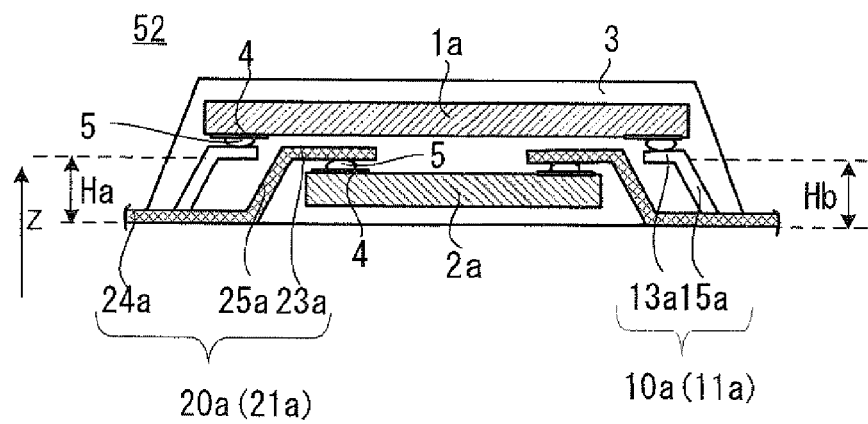
FIG. 5B is a cross sectional view taken along the line VB-VB of FIG. 5A.

An example of the semiconductor device having a structure different from the first embodiment will now be described. In the following description, the same components as those of the first embodiment are denoted by identical reference numerals, and overlapping description thereof will be omitted as appropriate. FIG. 5A shows a plane view showing a structure of a semiconductor device 52 according to the second embodiment, and FIG. 5B shows a cross sectional view taken along the line VB-VB of FIG. 5A. In FIG. 5A, a position where the mold resin 3 is formed is shown by dotted lines, and the upper stage side semiconductor chip 1a is shown as if it is transparent in order to describe the underlying structure of the upper stage side semiconductor chip 1a for the sake of convenience.

The basic structure of the semiconductor device 52 according to the second embodiment is substantially the same as that of the semiconductor device 51 according to the first embodiment except the following point. The first lead part 11 and the second lead part 21 are formed not to overlap with each other in the planar view in the first embodiment. On the other hand, a part of a first lead part 11a and a part of a second lead part 21a are overlapped in the planar view in the second embodiment. However, as shown in FIG. 5A, a first inner lead part 13a and a second inner lead part 23a are formed not to overlap with each other in the planar view, which means the first inner lead part 13a and the second inner lead part 23a are formed in substantially the same plane in both the first embodiment and the second embodiment.

Further, the first rising part 15 of the first lead part 11 and the second rising part 25 of the second lead part 21 are formed so as to overlap with each other in a side view (when seen from the cross sectional direction of FIG. 1B) in the first embodiment. On the other hand, the first rising part 15a of the first lead part 11a and the second rising part 25a of the second lead part 21a are formed not to overlap with each other in the side view in the second embodiment. Further, the distance from the top of the inner lead part to the frame body part of the first lead frame in the planar view and the distance from the top of the inner lead part to the frame body part of the second lead frame in the planar view are the same in the first embodiment, whereas the distances are different from each other in the second embodiment.

Further, the size of the upper stage side semiconductor chip 1 and the size of the lower stage side semiconductor chip 2 are made substantially the same in the first embodiment. On the other hand, the size of the upper stage side semiconductor chip 1a is larger than that of the lower stage side semiconductor chip 2a in the second embodiment. Further, the first lead part 11 and the second lead part 21 are formed substantially in straight line shape in the first embodiment, whereas some inner lead parts have a bending shape in the second embodiment.

Figure 6A:
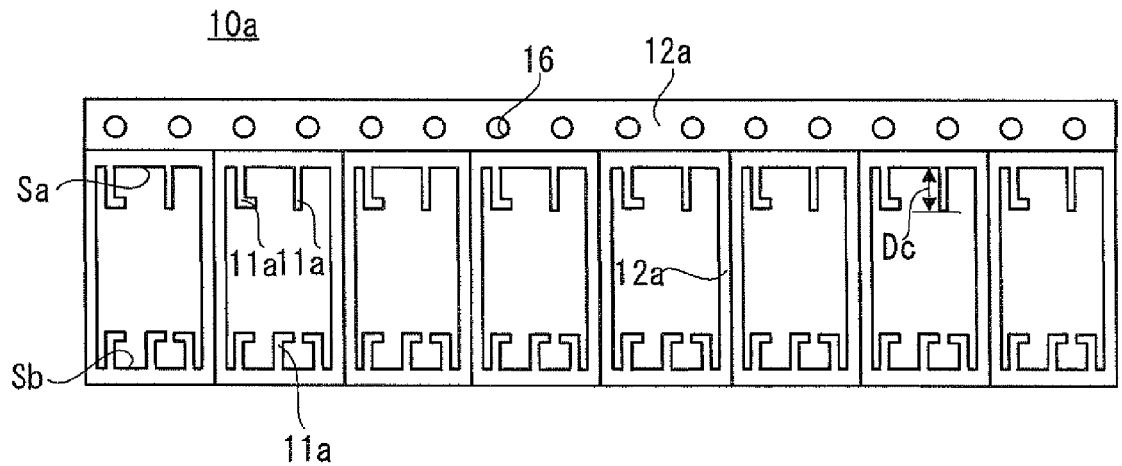
FIG. 6A is a plane view of a first lead frame according to the second embodiment.
Figure 6B:
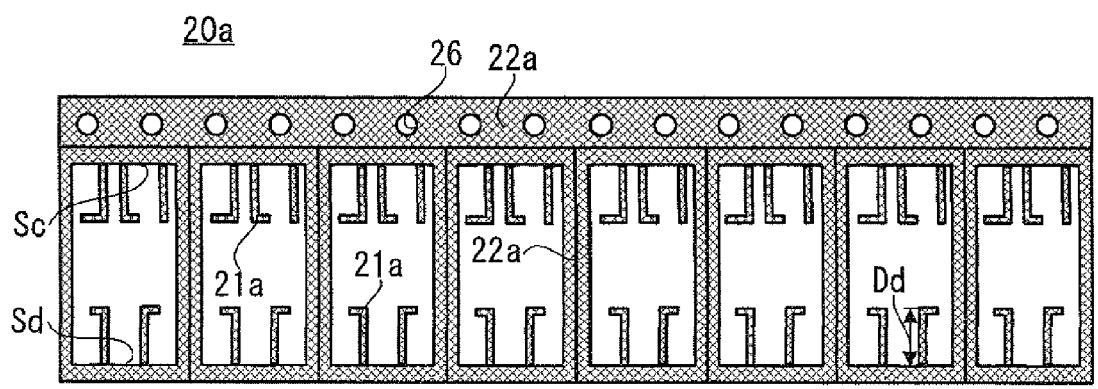
FIG. 6B is a plane view of a second lead frame according to the second embodiment.
Figure 6C:
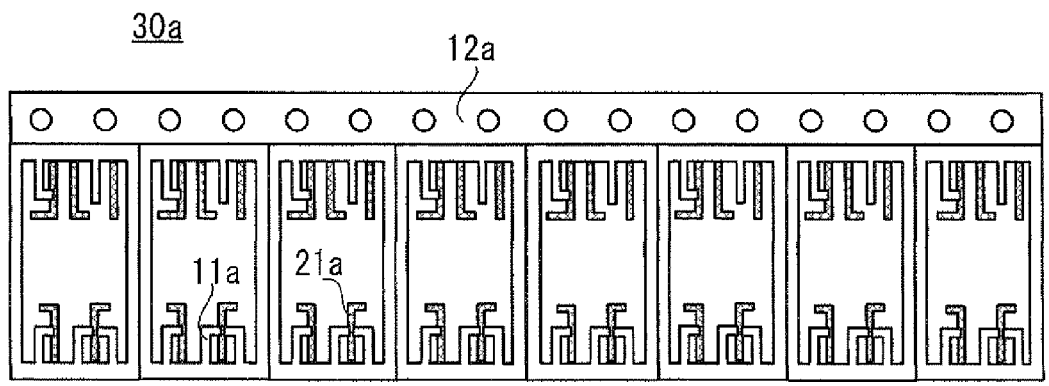
FIG. 6C is a plane view of a laminated-type lead frame according to the second embodiment.
Figure 7:
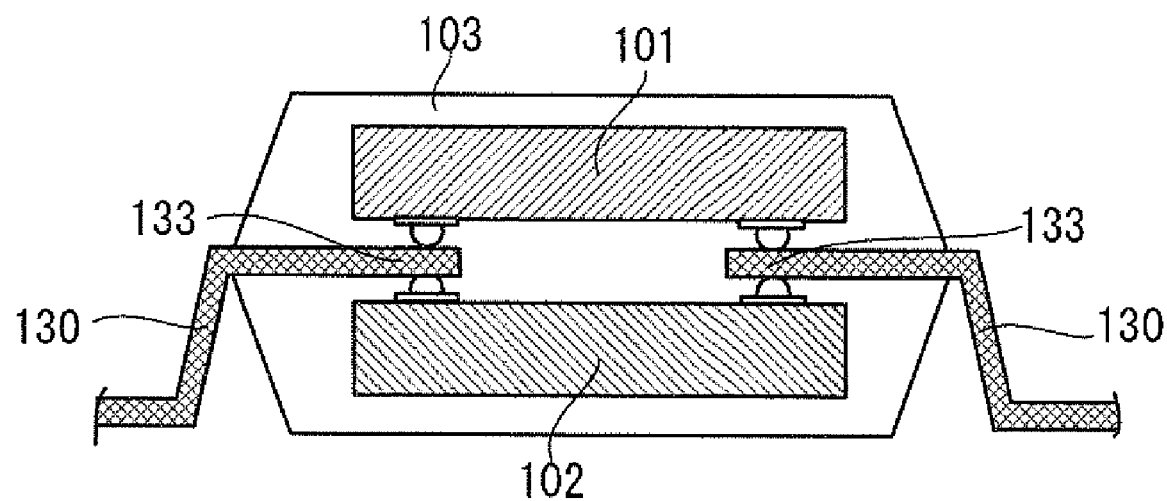
FIG. 7 is a side view of a semiconductor device according to a prior art 1.
Figure 9A:
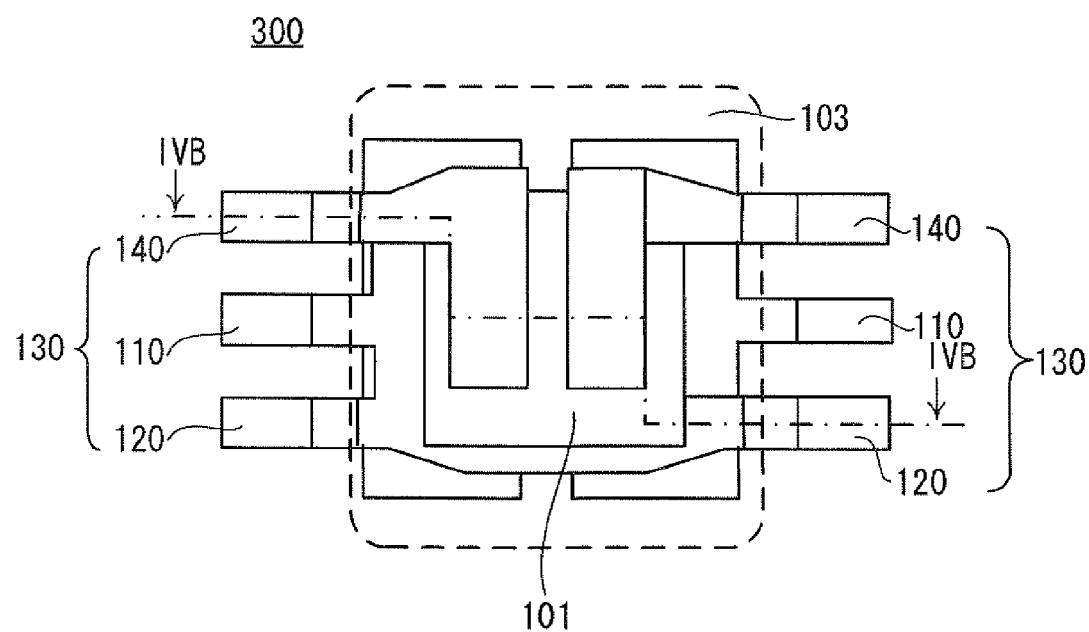
FIG. 9A is a plane view of a semiconductor device according to a prior art 3.
Figure 9B:
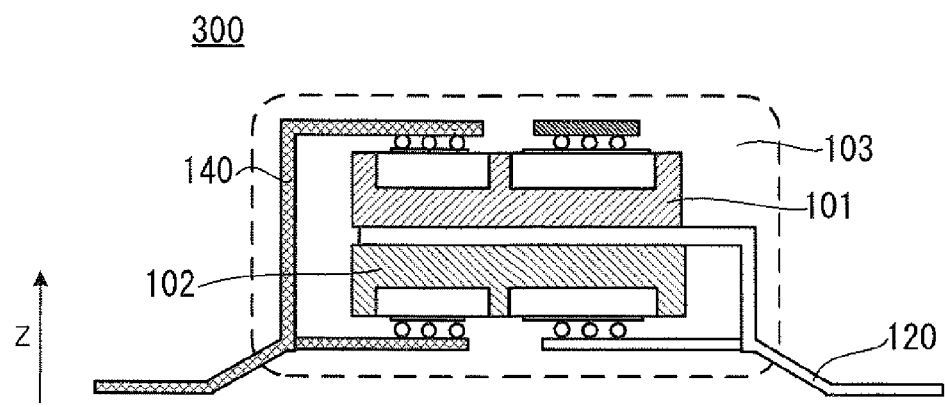
FIG. 9B is a cross sectional view of the semiconductor device according to the prior art 3.

FIG. 6A is a plane view of the first lead frame 10a according to the second embodiment, FIG. 6B is a plane view of the second lead frame 20a according to the second embodiment, and FIG. 6C is a plane view of a lead frame 30a having a laminated structure in which the first lead frame 10a and the second lead frame 20a are integrally laminated together. The first lead frame 10a includes a first lead part 11a, a first frame body part 12a, a first alignment part 16, and eight rectangular hollow parts and the like, as shown in FIG. 6A.

Five first lead parts 11a are formed in each of the eight hollow parts of the first lead frame 10a. Two of the five first lead parts 11a are formed in a side Sa where the first alignment parts 16 are formed among the sides forming the hollow part, and the rest of the three first lead parts 11a are formed in a side Sb opposed to the side Sa. As shown in FIG. 6A, the first lead parts formed in L shape and the first lead parts in straight line shape in the planar view are mixed in the second embodiment.

The second lead frame 20a includes a second lead part 21a, a second frame body part 22a, a second alignment part 26, eight rectangular hollow parts and the like as shown in FIG. 6B. Five second lead parts 21a are formed in each of the eight hollow parts of the second lead frame 20. Three of the five second lead parts 21a are formed in a side Sc where the second alignment parts 26 are formed among the sides forming the hollow parts, and the rest of the two second lead parts 21a are formed in a side Sd opposed to the side Sc. As shown in FIG. 6B, in the second embodiment, the second lead parts in the L shape and the second lead parts in the straight line shape in the planar view are mixed.

In the second embodiment, a length in a longitudinal direction of the first lead part 11a of the first lead frame 10a and a length in the longitudinal direction of the second lead part 21a of the second lead frame 20a are different from each other. In other words, a distance Dc (see FIG. 6A) from the top of the first inner lead part 13a to the first frame body part 12a of the first lead part 11a in the planar view and a distance Dd (see FIG. 6B) from the top of the second inner lead part 23a to the second frame body part 22a formed in the second lead part 21a in the planar view are different from each other. Further, as shown in FIG. 5B, the position in the first lead part 11a where the first rising part 15a is formed and the position in the second lead part 21a where the second rising part 25a is formed are different in the side view shown in FIG. 5B.

The height of the first rising part 15a, which is the height of the step Ha between the first inner lead part 13a and the first outer lead part 14a in the Z direction in FIG. 5B, is the same for all the first rising parts 15a in the first lead part 11a in the first lead frame 10a. Further, the height of the second rising part 25a, which is the height of the step Hb between the second inner lead part 23a and the second outer lead part 24a in the Z direction in FIG. 5B, is the same for all the second rising parts 25a in the second lead part 21a in the second lead frame 20a. Further, the height of the step Ha of the first rising part 15a and the height of the step Hb of the second rising part 25a are made to be the same.

In the manufacturing process of the semiconductor device 52 according to the second embodiment, the first lead frame 10a and the second lead frame 20a are laminated together to function as one integrated lead frame (lead frame 30a having a laminated structure) as shown in FIG. 6C.

When the first lead frame 10a and the second lead frame 20a are laminated together, a part of the first lead part 11a of the first lead frame 10a and a part of the second lead part 21a of the second lead frame 20a overlap with each other in the planar view as shown in FIG. 6C. However, as described above, since the position where the first rising part 15a is formed and the position where the second rising part 25a is formed are shifted with each other, the first lead part 11a and the second lead part 21a do not contact with each other. The first frame body part 12a and the second frame body part 22a are removed in the post-process and do not remain in the end product in both the first embodiment and the second embodiment. Therefore, only the first lead part 11a and the second lead part 21a remain as the end product.

According to the second embodiment, since the distance from the top of the first inner lead part 13a to the first frame body part 12a of the first lead frame 10a and the distance from the top of the second inner lead part 23a to the second frame body part 22a of the second lead frame 20a are formed to be different with each other, it is possible to readily adjust the elements so that the first inner lead part 13a and the second inner lead part 23a do not contact with each other. The lead frame 30a according to the second embodiment is especially effective when the size of the upper stage side semiconductor chip 1a and the size of the lower stage side semiconductor chip 2a are different. This structure provides a high flexibility for combining the chips having different size or shape.

The shape and the structure of the lead frames in the first and second embodiments are merely an examples and various changes can be made without departing from the spirit of the present invention. The shape of the frame body part, the number of hollow parts, the number and the shape of the lead parts in the lead frame can be changed according to its application. The present invention can be applied to a device having one or more hollow part(s) and lead part(s).

In the first and second embodiments, one upper stage side semiconductor chip is provided in the upper side of the inner lead part of the semiconductor device and one lower stage side semiconductor chip is provided in the lower side thereof. However, the present invention is not limited to this. For example, it is also possible to mount two or more semiconductor chips on the upper side or/and the lower side of the inner lead part. The shape of each hollow part formed in the same lead frame, and the number and the shape of the lead parts in each hollow part do not have to be the same but can be changed or modified as appropriate. Although the description has been made of the example in which each width of each lead part is the same, the present invention is not limited to the described example.

Alternatively, an island or the like may be provided in the lead frame by a known method. Further alternatively, the thickness of the frame body part may be increased or a connecting part or the like may be provided in order to increase the mechanical strength of the lead frame itself. Further, it is possible to change the alignment, the shape, or the method of the alignment part formed in the frame body part as appropriate. The height of the step Ha of the first lead frame and the height of the step Hb of the second lead frame can also be changed depending on its applications.

Instead of connecting the semiconductor chips by flip chip mount, the electrode plane of the upper stage side semiconductor chip and the electrode plane of the lower stage side semiconductor chip may be back-to-back opposed to form wire bonding connection. In this case, wire connection can be performed in each of the first lead frame and the second lead frame, whereby it is possible to readily perform the wire bonding connection. Needless to say, it is possible to employ both the flip chip connection and the wire bonding connection.

It is apparent that the present invention is not limited to the above embodiment but may be modified and changed without departing from the scope and spirit of the invention.

What is claimed is:

1. A method of manufacturing a semiconductor device, comprising the steps of:
    fixing an upper stage side semiconductor chip on a front surface of an inner lead part of a first lead frame and a lower stage side semiconductor chip on a rear surface of an inner lead part of a second lead frame;
    overlapping at least a part of a frame body part of the first lead frame and a part of a frame body part of the second lead frame;
    sealing with a mold resin the upper stage side semiconductor chip, the lower stage side semiconductor chip, the inner lead part of the first lead frame, and the inner lead part of the second lead frame; and
    separating the semiconductor device by removing the frame body part of the first lead frame and the frame body part of the second lead frame, such that the first lead frame and the second lead frame are electrically isolated from each other.

2. The method of manufacturing a semiconductor device according to claim 1, wherein the upper stage side semiconductor chip is flip-chip mounted on the first inner lead part and the lower stage side semiconductor chip is flip-chip mounted on the second inner lead part.

3. The method of manufacturing a semiconductor device according to claim 1, wherein a distance from a top of the inner lead part to the frame body part of the first lead frame in a planar view and a distance from a top of the inner lead part to the frame body part of the second lead frame in the planar view are substantially the same.

4. The method of manufacturing a semiconductor device according to claim 1, wherein a distance from a top of the inner lead part to the frame body part of the first lead frame in a planar view and a distance from a top of the inner lead part to the frame body part of the second lead frame in the planar view are different from each other.

5. The method of manufacturing a semiconductor device according to claim 1, wherein the upper stage side semiconductor chip and the lower stage side semiconductor chip are different types of chips.

6. The method of manufacturing a semiconductor device according to claim 1, wherein the upper stage side semiconductor chip and the lower stage side semiconductor chip are the same types of chips.

7. The method of manufacturing a semiconductor device according to claim 1, wherein the upper stage side semiconductor chip and the lower stage side semiconductor chip have different sizes.

8. The method of manufacturing a semiconductor device according to claim 1, wherein the step of overlapping at least parts of the frame body parts of the first and second lead frames includes interdigitating the inner lead parts of the first and second lead frames.

9. The method of manufacturing a semiconductor device according to claim 8, wherein the inner lead parts of the first and second lead frames are provided in substantially the same plane.

10. The method of manufacturing a semiconductor device according to claim 1, wherein the inner lead parts of the first and second lead frames are provided to overlap each other.

11. The method of manufacturing a semiconductor device according to claim 1, wherein a geometry of the inner lead part of the first lead frame is different from a geometry of the inner lead part of the second lead frame.

12. The method of manufacturing a semiconductor device according to claim 1, wherein the inner lead part of the first lead frame does not contact the inner lead part of the second lead frame.

13. A method of manufacturing a semiconductor device, comprising the steps of:
    mounting an upper stage side semiconductor chip on a tip portion of an inner lead part of a first lead frame and a lower stage side semiconductor chip on a tip portion of an inner lead part of a second lead frame, respectively;

overlapping at least a part of a frame body part of the first lead frame and a part of a frame body part of the second lead frame so that the tip portion of the inner lead part of the first lead frame and the tip portion of the inner lead part of the second lead frame are sandwiched between the upper stage side semiconductor chip and the lower stage side semiconductor chip, a tip portion of the inner lead part of the first lead frame and a tip portion of the inner lead part of the second lead frame do not contact with each other, and the tip portion of the inner lead part of the first lead frame and the tip portion of the inner lead part of the second lead frame are provided in the same plane;

sealing with a mold resin the upper stage side semiconductor chip, the lower stage side semiconductor chip, the inner lead part of the first lead frame, and the inner lead part of the second lead frame; and separating the semiconductor device by removing the frame body part of the first lead frame and the frame body part of the second lead frame.

14. The method of manufacturing a semiconductor device according to claim 13, wherein the upper stage side semiconductor chip is flip-chip mounted on the tip portion of the inner lead part of the first lead frame and the lower stage side semiconductor chip is flip-chip mounted on the tip portion of the inner lead part of the second lead frame, respectively.

15. The method of manufacturing a semiconductor device according to claim 13, wherein a distance from a top of the inner lead part to the frame body part of the first lead frame in a planar view and a distance from a top of the inner lead part to the frame body part of the second lead frame in the planar view are substantially the same.

16. The method of manufacturing a semiconductor device according to claim 13, wherein a distance from a top of the inner lead part to the frame body part of the first lead frame in a planar view and a distance from a top of the inner lead part to the frame body part of the second lead frame in the planar view are different from each other.

17. The method of manufacturing a semiconductor device according to claim 13, wherein the inner lead part of the first lead frame is pressed to form a rising part between the tip portion and an outer lead part thereof, the lower stage side semiconductor chip is mounted at a side that the rising part thereof is provided in a cross sectional view.

18. The method of manufacturing a semiconductor device according to claim 17, wherein the first lead frame is set that the rising part is seemed to a depressed part when the lower stage side semiconductor chip is mounted on the tip portion of the inner lead part of the first lead frame.

19. The method of manufacturing a semiconductor device according to claim 18, wherein the first lead frame that the lower stage side semiconductor chip is mounted is turned upside down before the overlapping at least a part of a frame body part of the first lead frame and a part of a frame body part of the second lead frame.

20. The method of manufacturing a semiconductor device according to claim 13, wherein the inner lead part of the second lead frame is pressed to form a rising part between the tip portion and an outer lead part thereof, the upper stage side semiconductor chip is mounted at an opposite side from a side that the rising part thereof is provided in a cross sectional view.

* * * * *